United States Patent
Tanjo

(10) Patent No.: US 9,299,529 B2
(45) Date of Patent: *Mar. 29, 2016

(54) ION SOURCE AND REPELLER STRUCTURE

(75) Inventor: Masayasu Tanjo, Kyoto (JP)

(73) Assignee: NISSIN ION EQUIPMENT CO., LTD., Kyoto (JP)

( * ) Notice: Subject to any disclaimer, the term of this patent is extended or adjusted under 35 U.S.C. 154(b) by 1066 days.

This patent is subject to a terminal disclaimer.

(21) Appl. No.: 13/408,579

(22) Filed: Feb. 29, 2012

(65) Prior Publication Data

US 2012/0255490 A1  Oct. 11, 2012

(30) Foreign Application Priority Data

Apr. 5, 2011 (JP) ................................. 2011-083948

(51) Int. Cl.
| | |
|---|---|
| C23C 14/00 | (2006.01) |
| C25B 11/00 | (2006.01) |
| C25B 13/00 | (2006.01) |
| H01J 27/02 | (2006.01) |
| H01J 37/08 | (2006.01) |
| H01J 37/317 | (2006.01) |
| H01J 27/20 | (2006.01) |

(52) U.S. Cl.
CPC ............... H01J 27/02 (2013.01); H01J 27/205 (2013.01); H01J 37/08 (2013.01); H01J 37/3171 (2013.01); *H01J 2237/081* (2013.01)

(58) Field of Classification Search
CPC ...... H01J 37/08; H01J 37/3171; H01J 27/022
See application file for complete search history.

(56) References Cited

U.S. PATENT DOCUMENTS

| | | | | |
|---|---|---|---|---|
| 4,842,703 | A | * | 6/1989 | Class et al. ............... 204/192.12 |
| 4,957,605 | A | * | 9/1990 | Hurwitt et al. ........... 204/192.12 |
| 6,661,014 | B2 | | 12/2003 | Reyes |
| 6,768,121 | B2 | | 7/2004 | Horsky et al. |
| 2002/0130270 | A1 | * | 9/2002 | Reyes ........................ 250/423 R |
| 2006/0163489 | A1 | * | 7/2006 | Low et al. ...................... 250/426 |

FOREIGN PATENT DOCUMENTS

| | | |
|---|---|---|
| JP | 2001-035401 A | 2/2001 |
| JP | 2002-117780 A | 4/2002 |

* cited by examiner

*Primary Examiner* — Ibrahime A Abraham
(74) *Attorney, Agent, or Firm* — Procopio, Cory Hargreaves & Savitch LLP

(57) ABSTRACT

A repeller structure comprises a target member configured to be sputtered by a plasma to emit given ions, and provided with a through-hole penetrating between a sputterable surface and a reverse surface thereof, and a repeller body which supports the target member while being inserted in the through-hole of the target member, and has a repeller surface exposed on the side of the sputterable surface through the through-hole. The target member is made of a material selected from the group consisting of gallium oxide, gallium nitride, gallium phosphide, gallium arsenide and gallium fluoride.

7 Claims, 12 Drawing Sheets

ION SOURCE AND REPELLER STRUCTURE

BACKGROUND OF THE INVENTION

1. Field of the Invention

The present invention relates to an ion source, and more particularly to a repeller structure disposed in opposed relation to an electron emitting cathode within a plasma generating chamber of an ion source to reflect the electrons toward the cathode.

2. Description of the Background Art

In recent years, it has been studied to, in a plasma generating chamber of an ion source, ionize a source gas by a cathode to generate a plasma, and sputter a target material by the generated plasma to allow desired ion species to be contained in an ion beam.

Specifically, the target material is provided at a distal end of a repeller and held in a replaceable manner so as to allow stable generation of ion species, as disclosed in the following Patent Document 1. A detailed structure therefor comprises a tubular repeller, and a target member (slug) which is housed in a distal end of the repeller. The repeller has a stepped portion provided on an inner peripheral surface of the distal end thereof to protrude inwardly, and the target member has a lockable portion provided on an outer peripheral surface thereof and configured to be locked to the stepped portion. The target member is fixed inside the repeller by locking the lockable portion of the target member to the stepped portion of the repeller, and then screwing an externally-threaded block into a threaded portion formed on an inner peripheral surface of the repeller, from the side of an upper end of the repeller.

The above structure is configured such that the outer peripheral surface of the target member is locked by the repeller. However, considering that the repeller is disposed within the plasma generating chamber, i.e., a limited space, there is a restriction on the size of the repeller. Thus, the size of the target member to be housed in the repeller will be restricted, which poses a problem of difficulty in increasing an area of a sputterable surface (a sputterable surface area) of the target member.

The above structure in which the repeller is disposed around the outer peripheral surface of the target member has another problem of an increase in size of the repeller. Further, the threaded portion is provided on the inner peripheral surface of the tubular repeller to allow the externally-threaded block to be screwed thereinto. This results in structural complexity of the repeller, and is likely to cause increases in material cost and machining cost when the repeller is fabricated from a single member by cutting.

Moreover, the above structure is configured such that, with respect to electrons emitted from a cathode, the repeller is disposed around an outer periphery of the target member, which means that a member opposed to an electron emitting portion of the cathode is the target member. This causes problems of deterioration in electron reflection efficiency and thus deterioration in plasma generation efficiency.

Meanwhile, in connection with miniaturization of large scale integration (LSI), there is a need for a technique of shallowly forming a high-concentration and activated impurity layer. The following Non-Patent Document 1 reports that, when pre-amorphization is performed by Ga ion implantation, a p+ diffusion layer having a resistance reduced by 20% or more as compared to pre-amorphization performed by Ge ion implantation is formed, irrespective of heat treatment conditions. Therefore, there arises a need for an apparatus for implanting Ga ions into a substrate.

In this connection, the Patent Document 2 discloses an ion source designed to mix an organic metal gas (e.g., gaseous triethylgallium [Ga $(C_2H_5)_3$]) with an inert gas, and generate an ion beam containing gallium ions.

However, the organic metal gas itself has a strong reactivity in many cases, and active molecules and active atoms generated by ionizing the organic metal gas also have a strong reactivity in many cases. Thus, an ion source configured to introduce such an organic metal gas directly into a plasma generating chamber has the following problems:

(1) Components, such as a filament, a repeller and an insulator, in the plasma generating chamber, are subjected to alteration, which causes a change in amount of generation of plasma (plasma generation amount) and thus in amount of generation of ion beam (ion beam generation amount), and a shortening of the usable life of the components;

(2) Contamination is more likely to occur in the plasma generating chamber. This contamination causes an insulation failure, for example, between the filament and the plasma generating chamber, to hinder a stable operation of the ion source; and (3) In order to remove the contamination, it is necessary to frequently perform maintenance for the ion source. Moreover, the ion source using an organic metal gas and an inert gas as a source gas becomes structurally complicated.

LIST OF PRIOR ART DOCUMENTS

Patent Documents

Patent Document 1: JP 2002-117780A
Patent Document 2: JP 2001-35401A

Non-Patent Documents

Non-Patent Document 1: T. Hoshi and three other coauthors, "Technique for forming ultrashallow pn junction through Ga PAI", Proceedings of the 48th Joint Symposium on Applied Physics, The Japan Society of Applied Physics, 2001, p. 887

SUMMARY OF THE INVENTION

Problem to be Solved by the Invention

Therefore, the present invention has been made to solve the above problems, and a primary intended object thereof is to generate a gallium ion-containing ion beam without using an organic metal gas, and improve efficiency of reflecting electrons emitted from a cathode, by increasing a sputterable surface area as large as possible while facilitating not only simplification of a mounting structure for a target member but also downsizing of a repeller structure.

Means for Solving the Problem

In order to achieve the above object, the present invention provides an ion source which comprises: a plasma generating chamber configured to serve as both a container for generating therein a plasma, and an anode, while allowing a source gas to be introduced therein, and provided with an ion extraction port; a cathode provided in the plasma generating chamber and configured to emit electrons for ionizing the source gas to generate a plasma; and a repeller structure disposed in opposed relation to the cathode within the plasma generating chamber to reflect the electrons toward the cathode, wherein the repeller structure comprises: a target member configured to be sputtered by the plasma to emit given ions, and provided with a through-hole penetrating between a sputterable surface (obverse surface) and a reverse surface thereof; and a repeller body which supports the target member while being inserted in the through-hole of the target member, and has a repeller surface exposed on the side of the sputterable surface through the through-hole, and wherein the target member is made of a material selected from the group consisting of gallium oxide ($Ga_2O_3$), gallium nitride (GaN), gallium phosphide (GaP), gallium arsenide (GaAs) and gallium fluoride ($GaF_3$).

In the above ion source of the present invention, the target member made of a gallium-containing material, such as gallium oxide, gallium nitride, gallium phosphide, gallium arsenide and gallium fluoride, is exposed to a plasma. Then, due to erosion by ions and radicals in the plasma, sputtering by ions in the plasma, etc., gallium particles such as gallium ions are emitted from the target member into the plasma, so that gallium ions are contained in the plasma. Therefore, it becomes possible to generate an ion beam containing the gallium ions. Thus, the aforementioned problems involved in the conventional ion source configured to introduce an organic metal gas (e.g., gaseous triethylgallium [Ga ($C_2H_5$)$_3$]) into a plasma generating chamber can be solved.

Meanwhile, in cases where the target member is not an insulator, a floating potential will occur in the target member, which leads to a problem of difficulty in obtaining a sufficient sputtering rate. In the present invention, when the target member is made, particularly, of $Ga_2O_3$ which is an insulator (2000 MΩ or more as measured by a 1000 V Megger), the target member can be set to an earth potential without occurrence of a floating potential, so that it becomes possible to improve the sputtering rate.

In the above ion source of the present invention, the target member is provided with the through-hole, and the repeller body is supported while being inserted into the through-hole. Thus, a sputterable surface area of the target member can be increased as large as possible, irrespective of a configuration of the repeller body within the plasma generating chamber, so that it becomes possible to stably generate gallium ions for a long period of time. In addition, it becomes possible to downsize the repeller body, and lock the target member to the repeller body with a simple structure to facilitate a replacement operation of the target member. In the above ion source of the present invention, the repeller surface is exposed through the through-hole of the target member, so that it becomes possible to allow the repeller surface to be disposed opposed to an electron emitting portion of the cathode so as to improve the efficiency of reflecting electrons emitted from the cathode. This makes it possible to improve plasma generation efficiency.

Preferably, in the ion source of the present invention, the target member has a counterbored portion formed by diametrally expanding an opening region of the through-hole on the side of the sputterable surface, and the repeller body has a large-diameter portion formed at a distal end thereof and engageable with the counterbored portion, wherein, under a condition that the large-diameter portion is engaged with the counterbored portion, the target member is supported by the repeller body, and a distal edge surface of the large-diameter portion serves as the repeller surface. According to this feature, it becomes possible to readily perform positioning between the target member and the repeller body. Further, in cases where the repeller structure is disposed to be oriented vertically downwardly, it becomes possible to eliminate the use of an additional fixing component to allow the repeller structure to have a significantly simple configuration.

In a process of generating a gallium ion-containing ion beam, it is considered that consumption of the target member is greater than that of the repeller body. Therefore, as a result of consumption during the generating process, the repeller surface is likely to be located on the side of the cathode with respect to the sputterable surface. In this case, plasma ions are more likely to be pulled by the repeller surface located in front of the sputterable surface. Consequently, the plasma ions become less likely to collide with the sputterable surface, which causes a problem of deterioration in ion beam generation efficiency. Thus, it is desirable to solve this problem. For this purpose, the above ion source is preferably configured such that the sputterable surface is located on the side of the cathode with respect to the repeller surface, under the condition that the large-diameter portion is engaged with the counterbored portion.

It is desirable to lock the target member to the repeller body with a simple configuration. For this purpose, it is preferable that the repeller body has a threaded portion on an outer peripheral surface thereof, wherein a nut member is screwed onto the threaded portion from the side of the reverse surface of the target member, so that the target member is fixedly clamped by the large-diameter portion and the nut member.

It is desirable to allow ions to be evenly emitted from the target member, without taking into account circumferential mounting accuracy of the target member, or along a circumferential direction of the repeller surface. For this purpose, preferably, the target member has a generally circular disk shape, wherein the through-hole is formed in an approximately central region of the target member.

Preferably, in the ion source of the present invention, the sputterable surface of the target member includes a concave tapered surface or a concave curved surface, which is annularly formed about the through-hole. According to this feature, electrons reflected by the repeller structure can be concentrated around the ion extraction port, and a degree of ionization can be raised to increase an ion beam current.

It is desirable to improve electron reflection efficiency of the repeller surface as much as possible. For this purpose, preferably, a center of an electron emitting portion of the cathode and a center of the repeller surface are located approximately coaxially with each other.

Preferably, in the ion source of the present invention, the source gas is phosphorus fluoride ($PF_3$) or boron fluoride ($BF_3$). Particularly, in cases where the target member is made of $Ga_2O_3$, it is preferable to use $BF_3$ as the source gas.

Effect of the Invention

The present invention configured as above makes it possible to generate a gallium ion-containing ion beam without using an organic metal gas, and improve efficiency of reflecting electrons emitted from the cathode, by increasing a sputterable surface area as large as possible while facilitating not only simplification of a mounting structure for the target member but also downsizing of the repeller structure.

DESCRIPTION OF THE EXEMPLARY PREFERRED EMBODIMENTS

With reference to the drawings, the present invention will now be described based on an ion source according to an embodiment thereof.

Figure 1:
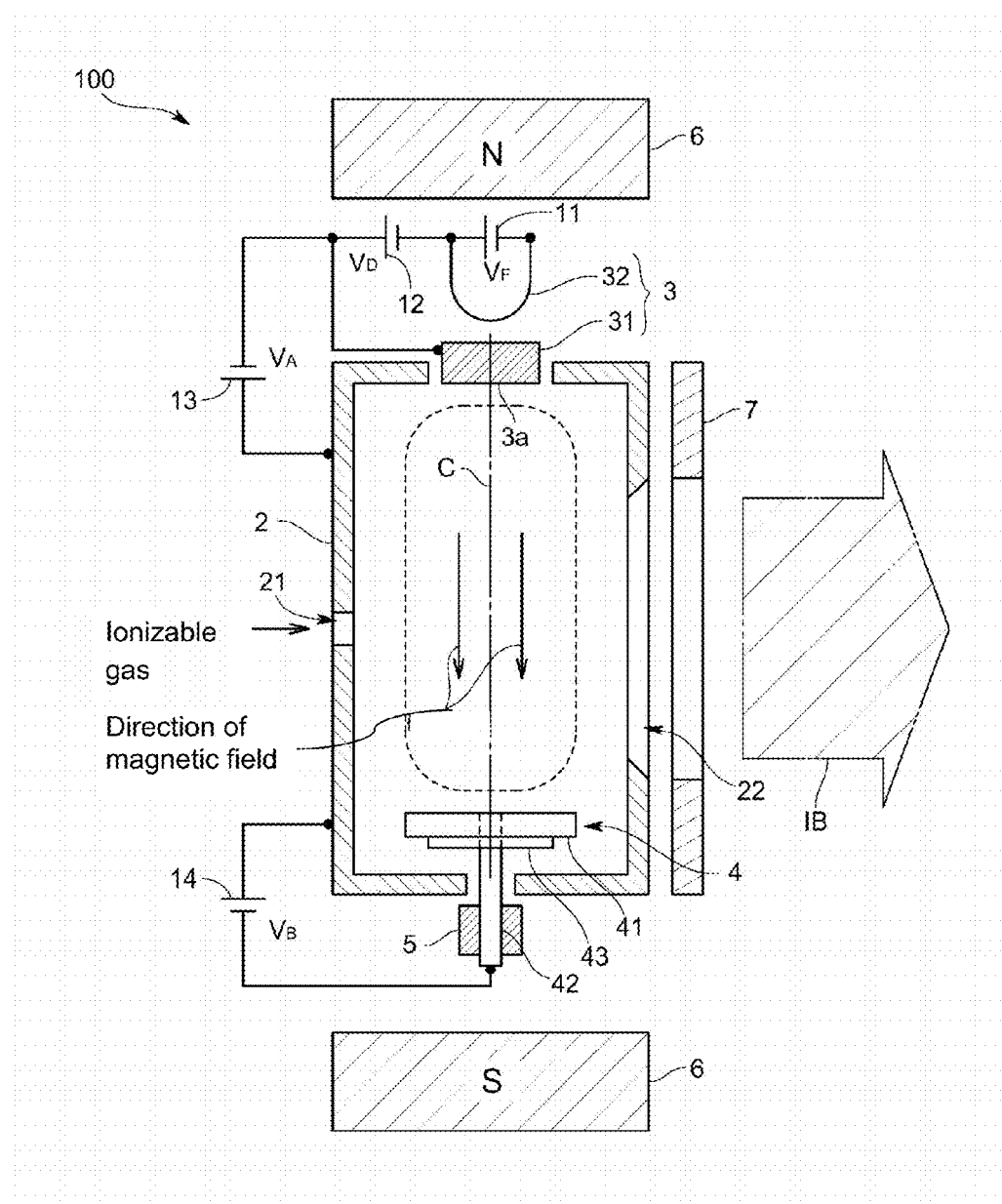
FIG. 1 is a schematic sectional view illustrating an ion source according to one embodiment of the present invention.

As illustrated in FIG. 1, an ion source 100 according to one embodiment of the present invention is designed to generate an ion beam IB containing gallium ions, and equipped with a plasma generating chamber 2, a hot cathode 3 provided in the plasma generating chamber 2, and a repeller structure 4 disposed in opposed relation to the hot cathode 3 within the plasma generating chamber 2.

The above components 2 to 4 will be described in detail below.

The plasma generating chamber 2 configured to serve as both a container (e.g., a rectangular parallelepiped-shaped container) for generating therein a plasma, and an anode for arc discharge, and provided with a gas inlet port 21 for introducing an ionizable gas serving as a source gas thereinto, and an ion extraction port 22 for extracting internally generated gallium ions to the outside. Each of the gas inlet port 21 and the ion extraction port 22 is formed in a wall of the plasma generating chamber 2.

An ionizable gas (e.g., a fluorine-containing ionizable gas) is introduced into the plasma generating chamber 2 via the gas inlet port 21. For example, the gas inlet port 21 may be provided at a position opposed to the ion extraction port 22, as illustrated in FIG. 1. The position of the gas inlet port 21 is not limited to such a position, but may be any other suitable position capable of introducing a source gas into the plasma generating chamber 2. It is preferable to use a fluorine-containing ionizable gas, because fluorine has an extremely strong chemical action and a strong reactivity with other materials, and therefore a plasma formed by ionizing the fluorine-containing ionizable gas has a strong action to cause an aftermentioned target member 41 to emit gallium ions.

For example, the fluorine-containing ionizable gas may be a gas containing fluoride such as phosphorus fluoride ($PF_3$) or boron fluoride ($BF_3$), or a gas containing fluorine ($F_2$). A fluoride gas or a fluorine gas may be directly used as the fluorine-containing ionizable gas. Alternatively, a gas obtained by diluting the fluoride or fluorine gas with an appropriate gas (e.g., helium gas) may be used as the fluorine-containing ionizable gas.

The hot cathode 3 is provided within the plasma generating chamber 2 at a position on one side (in FIG. 1, an upper side) of the plasma generating chamber 2 while being electrically insulated from the plasma generating chamber 2. The hot cathode 3 is designed to emit thermoelectrons into the plasma generating chamber 2.

The hot cathode 3 in this embodiment is called, "indirectly heated type", which comprises a cathode member 31 configured to emit thermoelectrons upon being heated, and a filament 32 for heating cathode member 31, as illustrated in FIG. 1.

The filament 32 is connected to a heating power supply 11 for heating the filament 32. A DC bombardment power supply 12 is connected between the filament 32 and the cathode member 31 while being disposed such that a positive terminal thereof is connected to the cathode member 31. The DC bombardment power supply 12 is designed to accelerate thermoelectrons emitted from the filament 32 toward the cathode member 31 to heat the cathode member 31 by utilizing bombardment of the thermoelectrons. A DC arc power supply 13 is connected between the cathode member 31 and the plasma generating chamber 2. The arc power supply 13 is designed to apply an arc voltage $V_A$ between the cathode member 31 and the plasma generating chamber 2 to create an arc discharge therebetween and thereby ionize the ionizable gas introduced in the plasma generating chamber 2 to generate a plasma. The arc power supply 13 is disposed such that a positive terminal thereof is connected to the plasma generating chamber 2.

The repeller structure 4 is provided within the plasma generating chamber 2 at a position on the other side (a side opposite to the hot cathode 3; in FIG. 1, a lower side) of the plasma generating chamber 2 and in opposed relation to the hot cathode 3. The repeller structure 4 is designed to reflect electrons (primarily, thermoelectrons emitted from the hot cathode 3; this will also be applied to the following description) within the plasma generating chamber 2, toward the hot cathode 3.

The repeller structure 4 is electrically insulated from the plasma generating chamber 2 through an insulator (in this embodiment, air gap). Specifically, as illustrated in FIGS. 2 and 3, the repeller structure 4 comprises a target member 41 configured to be sputtered by a plasma to emit gallium ions, and a repeller body 42 which supports the target member 41 and has a repeller surface 42X for reflecting electrons.

The repeller body 42 is applied with a negative bias voltage $V_B$ from a DC bias power supply 14, on the basis of a potential of the plasma generating chamber 2 (see FIG. 1). A level of the bias voltage $V_B$ is determined while taking into account a function of the repeller body 42 (repeller surface 42X) to reflect electrons, a function of plasma ions to sputter the target member 41 (sputterable surface 41A), etc. From such a point of view, it is preferable that the bias voltage $V_B$ is set, for example, in the range of about 40 to 150 V. Particularly, in cases where the ionizable gas is a gas containing boron fluoride ($BF_3$), it is more preferable that the bias voltage $V_B$ is set in the range of about 60 to 120 V.

The target member 41 is configured to be sputtered by a plasma to emit gallium ions. In this embodiment, the target member 41 is made of a solid, gallium-containing material, such as gallium oxide ($Ga_2O_3$), gallium nitride (GaN), gallium phosphide (GaP), gallium arsenide (GaAs) or gallium fluoride ($GaF_3$). Among them, gallium oxide ($Ga_2O_3$) may be used as a material for the target member 41. In this case, it becomes possible to prevent a floating potential from occurring in the target member 41 so as to allow the target member 41 to be set to an earth potential. This makes it possible to improve a sputtering rate.

Figure 2:
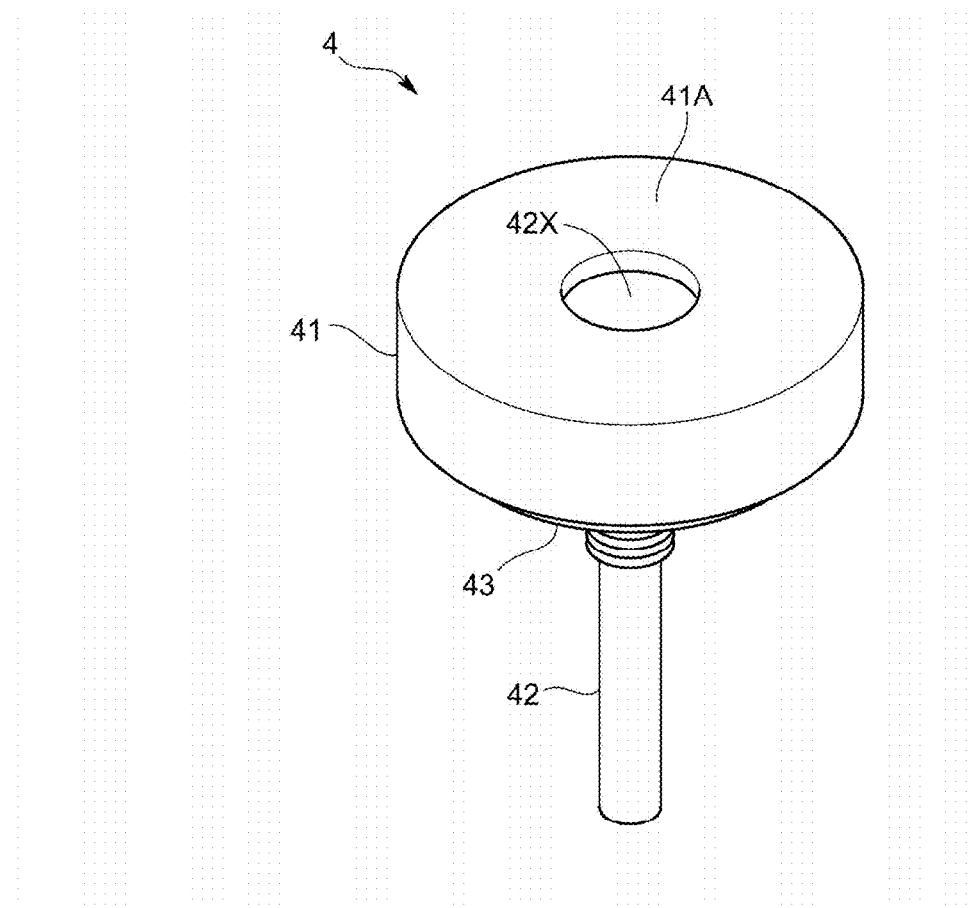
FIG. 2 is a schematic perspective view illustrating a repeller structure in the ion source according to the embodiment.
Figure 3:
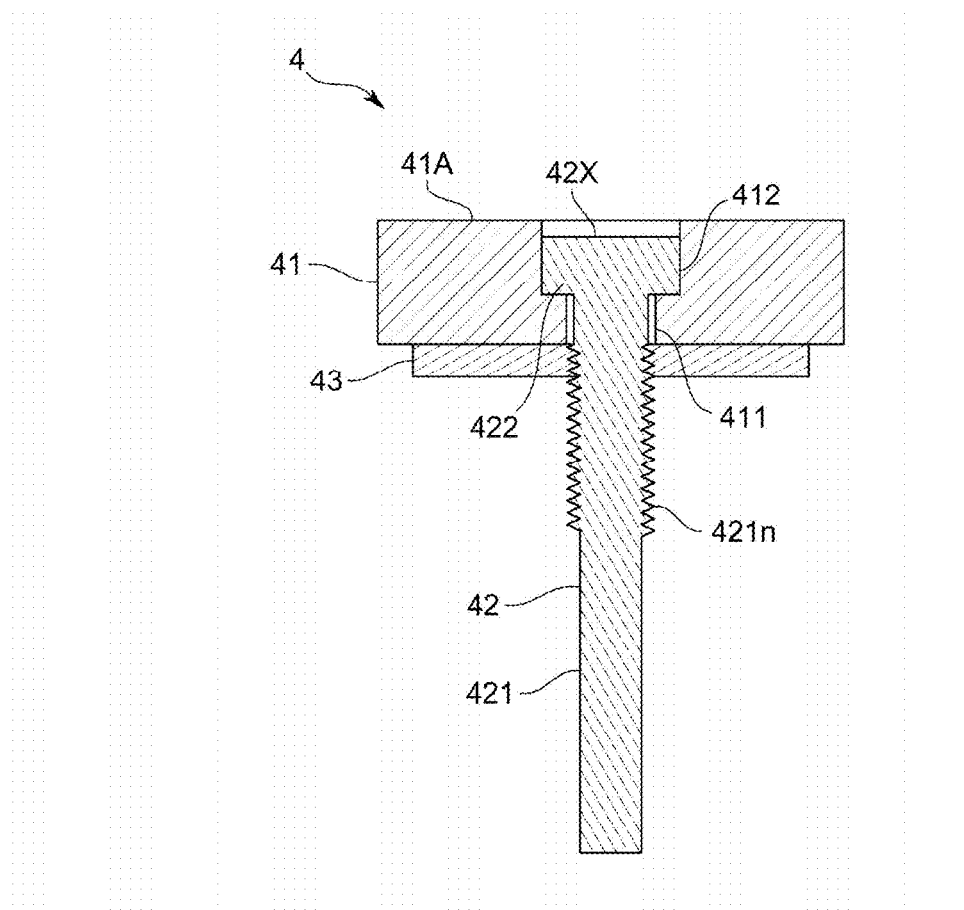
FIG. 3 is a schematic sectional view illustrating the repeller structure in the ion source according to the embodiment.
Figure 4:
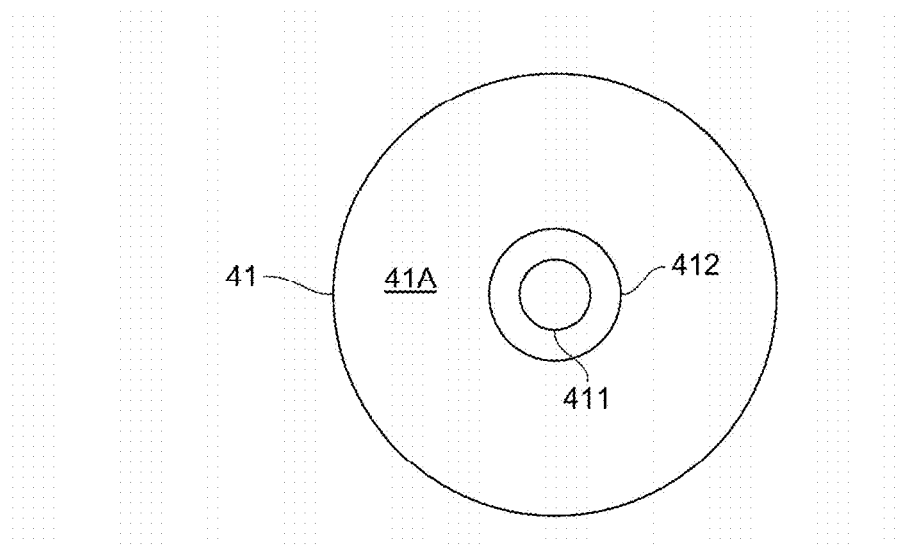
FIG. 4 is a top plan view illustrating a target member in the ion source according to the embodiment.

Specifically, as illustrated in FIGS. 2 to 4, the target member 41 has a generally circular disk shape in a generally central region of which a through-hole 411 is formed to penetrate between the sputterable surface 41A, i.e., the obverse surface thereof to be subjected to sputtering, and the reverse surface thereof. In this embodiment, the through-hole 411 is a circular hole having a sectional shape approximately equal to that of the repeller body 42 as described in detail later. However, it may be formed in any other suitable shape.

The target member 41 has a counterbored portion 412 formed by diametrally expanding an opening region of the through-hole 411 on the side of the sputterable surface 41A. The counterbored portion 412 is formed concentrically with the through-hole 411. In other words, the target member 41 in this embodiment has a shape of a solid of revolution.

As illustrated in FIGS. 2 and 3, the repeller body 42 has a generally columnar shape, and comprises a small-diameter portion 421 having an outer diameter insertable into and removable from the through-hole 411, and a large-diameter portion 422 having an outer diameter greater than that of the small-diameter portion 421 and non-insertable into the through-hole 411, and engageable with the counterbored portion 412.

A sectional shape (in this embodiment, a circular shape) of the large-diameter portion 422 taken along an axial direction thereof is approximately equal to a sectional shape (in this embodiment, a circular shape) of the counterbored portion 412 taken along an axial direction thereof, and the large-diameter portion 422 is configured to be fitted into the counterbored portion 412 without any rattle or with a slight rattle. As above, each of the target member 41 and the repeller body 42 has a shape of a solid of revolution, so that the repeller body 42 can be inserted into the through-hole 411 while allowing the large-diameter portion 422 to be fitted into the counterbored portion 412, irrespective of a radial relative position between the repeller body 42 and the target member 41. Thus, it becomes possible to simplify an assembling operation and a replacement operation of the target member 41.

The repeller body 42 is formed from a raw material (e.g., having a cross-sectionally uniform circular shape) by cutting. As a material for the repeller body 42, it is possible to use a high-melting point material, such as titanium (Ti), tantalum (Ta), tungsten (W), molybdenum (Mo) or carbon (C), or an alloy thereof.

A distal edge surface (in FIGS. 2 and 3, an upper surface) of the large-diameter portion 422 serves as the repeller surface 42X. Therefore, the repeller structure 4 is configured such that, under a condition that the repeller body 42 and the target member 41 are coupled together, the repeller surface 42X is exposed on the side of the sputterable surface 41A. Specifically, the repeller structure 4 is configured such that, under a condition that the large-diameter portion 422 is fitted in the counterbored portion 412, the repeller surface 42X can be visually recognized from the side of the sputterable surface 41A. This makes it possible to apply an electric field directly to electrons from the hot cathode 3 to improve electron reflection efficiency.

The repeller structure 4 is configured such that the large diameter portion 422 has an axial length less than that of the counterbored portion 412, i.e., under a condition that the large-diameter portion 422 is engaged with the counterbored portion 412, the sputterable surface 41A is located on the side of the cathode 3 with respect to the repeller surface 42X. This configuration makes it possible to, in an ion beam generation process, prevent deterioration in sputtering efficiency which would otherwise occur when the repeller surface 42X is located on the side of the cathode 3 with respect to the sputterable surface 41A, and thus prevent deterioration in ion beam generation efficiency. Thus, it becomes possible to stably supply an ion beam IB for a long period of time.

The repeller body 42 has a threaded portion 421n on an outer peripheral surface of a part or an entirety of a remaining portion other than the large-diameter portion 422 (i.e., on an axially-extending outer peripheral surface of a part or an entirety of the small-diameter portion 421) (see FIG. 3). Then, a nut member 43 is screwed onto the threaded portion 421n from the side of the reverse surface of the target member 41, so that the target member 41 is fixedly clamped by the large-diameter portion 422 and the nut member 43. This prevents the target member 41 from being pulled out of the repeller body 42. In this case, the threaded portion 421n may be formed in an appropriate area to allow the target member 41 to be fixedly clamped by the large-diameter portion 422 and the nut member 43. In this embodiment, the threaded portion 421n is formed in an area onto which the nut member 43 can be screwed, under the condition that the large-diameter portion 422 is engaged with the counterbored portion 412.

Figure 5:
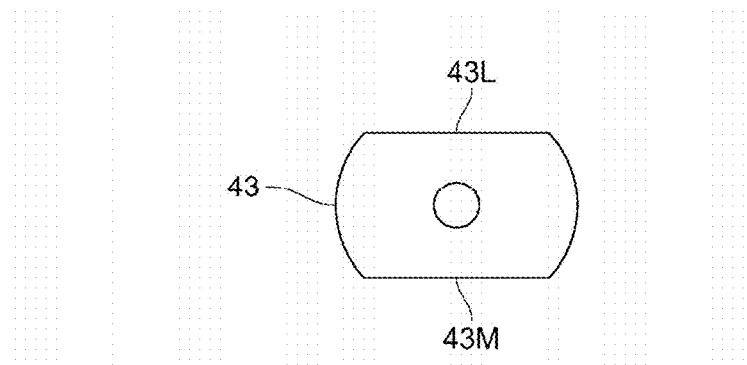
FIG. 5 is a top plan view illustrating a nut member in the ion source according to the embodiment.

As illustrated in FIG. 5, the nut member 43 has a generally circular ring shape. For example, the nut member 43 may be made of a high-melting point material, such as titanium (Ti), tantalum (Ta), tungsten (W), molybdenum (Mo) or carbon (C). In connection with a production process and a production cost, the nut member 43 tends to be formed in a circular ring shape. However, in this embodiment, the nut member 43 is cut to have at least two opposed sides 43L, 43M, so as to facilitate a fastening operation. This allows a user to manually fasten the nut member 43 in an easy manner.

The repeller structure 4 configured as above is held by a holding mechanism 5 (e.g., a clamp) provided outside the plasma generating chamber 2, and disposed such that a center of an electron emitting portion 3a of the cathode 3 and a center of the repeller surface 42X are located approximately coaxially with each other (approximately on an axis C) (see FIG. 1). In this state, the holding mechanism 5 is positioned with respect to the plasma generating chamber 2, in such a manner that it holds the repeller structure 4 to allow the center of the electron emitting portion 3a of the cathode 3 and the center of the repeller surface 42X to be located approximately coaxially with each other (approximately on the axis C). Specifically, the holding mechanism 5 holds one end of the repeller body 42 of the repeller structure 4 to which the target member 41 is not joined. In this configuration, the center of the repeller surface 42X and the center of the electron emitting portion 3a of the cathode 3 are located approximately coaxially with each other (approximately on the axis C), so that it becomes possible to improve the electron reflection efficiency. In this embodiment, a gap is defined between the plasma generating chamber 2 and the repeller structure 4 held by the holding mechanism 5. The gap serves as an insulator for electrically insulating the repeller structure 4 with respect to the plasma generating chamber 2.

The ion extraction port 22 is formed in an elongated slit-like shape along the axis C. The ion extraction port 22 formed along the axis C makes it possible to improve the ion beam generation efficiency.

Further, a magnet 6 is provided outside the plasma generating chamber 2 to generate a magnetic field along a line (axis C) connecting the hot cathode 3 and the repeller structure 4 (specifically, the repeller body 42), within the plasma generating chamber 2. The magnet 6 is composed, for example, of an electromagnet. Alternatively, it may be a permanent magnet. The orientation of the magnetic field may be reverse to that in FIG. 1.

Based on the presence the repeller structure 4 and the magnetic field, electrons within the plasma generating chamber 2 reciprocatingly move between the hot cathode 3 and the repeller structure 4 while circling about a direction of the magnetic field in the magnetic field, so that a probability of collision between the electrons and gas molecules of the ionizable gas becomes higher. Therefore, ionization efficiency of the ionizable gas is enhanced, and plasma generation efficiency is enhanced. More specifically, a high-density plasma can be generated between the hot cathode 3 and the repeller structure 4.

An extraction electrode system 7 is provided adjacent to an outlet of the ion extraction port 22 to extract an ion beam IB from the plasma generating chamber 2 (more specifically, from a plasma generated in the plasma generating chamber 2). Although the extraction electrode system 7 illustrated in FIG. 1 is made up of a single electrode, it is not limited thereto, but may be made of a plurality of electrodes.

In the ion source 100, the target member 41 made of gallium oxide is exposed to a plasma generated by ionizing the fluorine-containing ionizable gas. Then, due to erosion by ions and radicals, such as fluorine ions and radicals, in the plasma, sputtering by ions, such as fluorine ions, in the plasma, etc., gallium particles such as gallium ions are emitted from the target member into the plasma, so that gallium ions are contained in the plasma. Therefore, it becomes possible to generate an ion beam IB containing the gallium ions.

Figure 6:
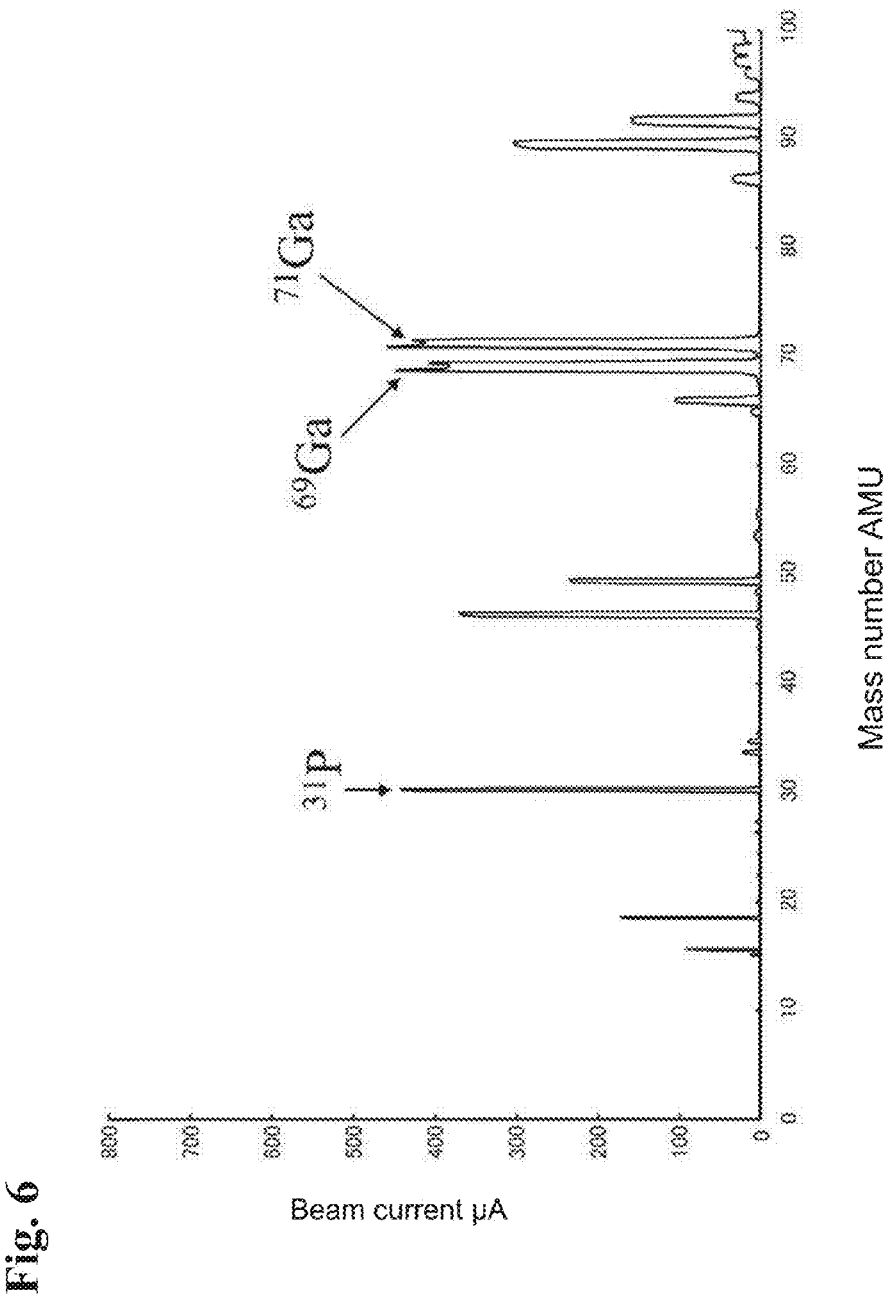
FIG. 6 is a mass spectrum chart illustrating a mass number of each of a gallium ion and a phosphorus ion.

FIG. 6 illustrates a mass spectrum obtained when gallium oxide ($Ga_2O_3$) is used as a material for the target member 41, and phosphorus fluoride ($PF_3$) is used as the ionizable gas (sputtering source gas). A mass number of a gallium ion includes 69 AMU and 71 AMU, and abundance ratios thereof are about 60% and about 40%, respectively. A mass number of a $PF_2$ ion is 69 AMU. Thus, it is desirable to select a gallium ion having a mass number of 71 AMU to avoid cross-contamination between a gallium ion and a $PF_2$ ion. A mass number of a phosphorus ion is 31 AMU. As seen in FIG. 6, a gallium ion beam current and a phosphorus ion beam current are generated approximately at the same level.

Figure 7:
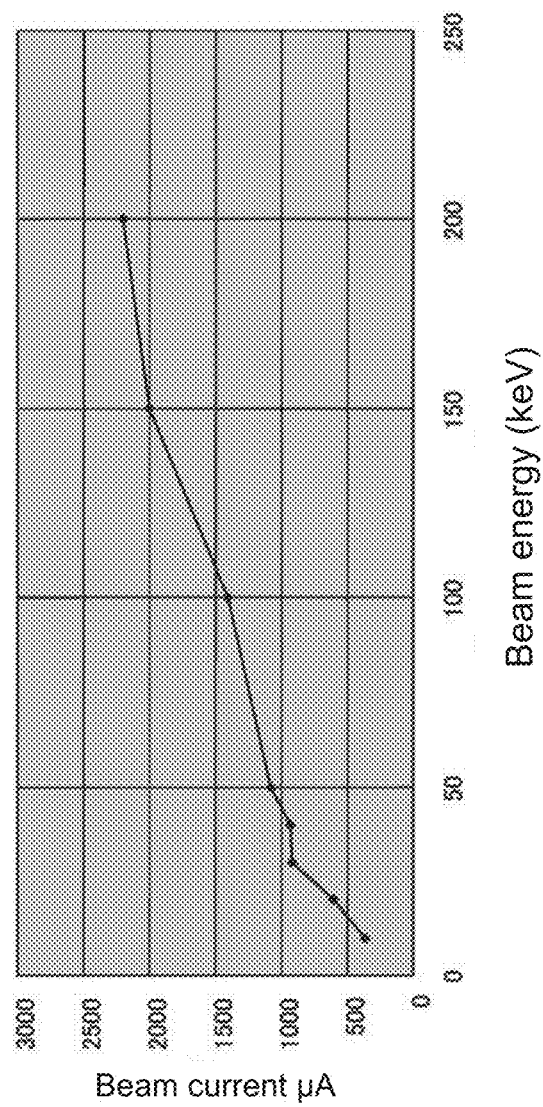
FIG. 7 is a graph illustrating a relationship between gallium ion current and beam energy.

FIG. 7 illustrates a gallium ion beam current at each beam energy value. A required dose of gallium ion in a halo ion implantation process is about $1 \times 10^{13}$ [$cm^{-2}$]. As described below, a sufficiently practicable beam current is generated.

$$D = I \times t/e/S, \text{ so that } t = e \times D \times S/I,$$

where:
  D=Dose=$5 \times 10^{13}$ [$cm^{-2}$];
  I=ion beam current=$5 \times 10^{-4}$ [A] (500 [$\mu$A]);
  e=quantum of electricity=$1.6 \times 10^{-19}$ [C]; and
  S=wafer area=$15^2 \pi \approx 706.9$ [$cm^2$],
wherein
  t=11.3 [sec].
In this calculation, as the dose, a currently conceivable maximum value ($5 \times 10^{13}$ [$cm^{-2}$]) has been selected.

Even if a wafer handling time, for example, two seconds, are added thereto, it is possible to obtain a throughput of 270 wafers/h. It can be said that this is a sufficient throughput as an ion implantation apparatus.

As described above, in the ion source 100 according to the above embodiment, a gallium-containing material such as gallium oxide is used as a material for the target member, so that the problems involved in the conventional ion source configured to introduce an organic metal gas (e.g., gaseous triethylgallium [$Ga(C_2H_5)_3$]) into a plasma generating chamber can be solved once for all.

In the above embodiment, the target member 41 is provided with the through-hole 411, and the repeller body 42 is supported while being inserted into the through-hole 411. Thus, an area of the sputterable surface 41A of the target member 41 can be increased as large as possible, without being restricted by a configuration of the repeller body 42 within the plasma generating chamber 2, so that it becomes possible to stably generate gallium ions for a long period of time. In addition, it becomes possible to downsize the repeller body 42, and lock the target member 41 to the repeller body 42 with a simple structure to facilitate a replacement operation of the target member 41. In the above embodiment, the repeller surface 42X is exposed through the through-hole 411 of the target member 41, so that it becomes possible to allow the repeller surface 42X to be disposed opposed to an electron emitting portion of the cathode 3 so as to improve the efficiency of reflecting electrons emitted from the cathode 3. This makes it possible to improve plasma generation efficiency and thus gallium ion beam (IB) generation efficiency.

It is to be understood that the present invention is not limited to the above embodiment.

Figure 8:
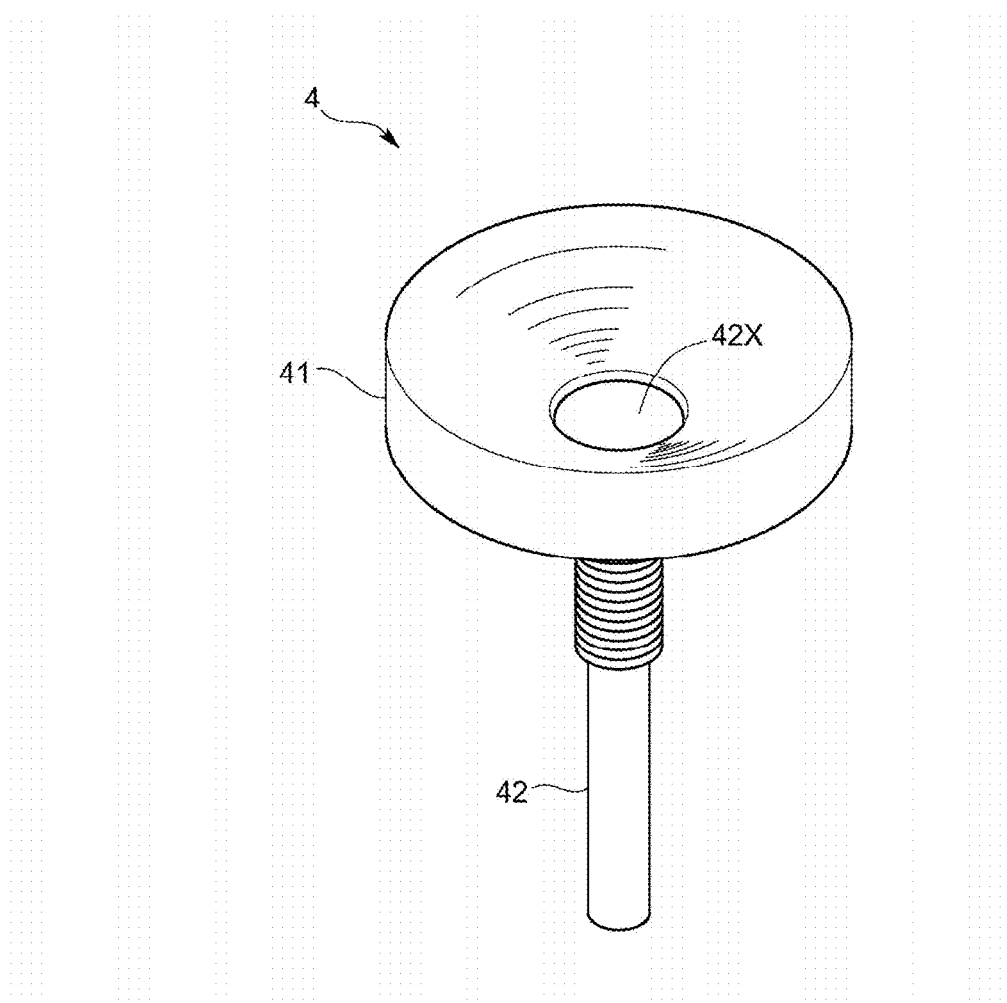
FIG. 8 is a schematic perspective view illustrating an example of modification of the repeller structure.
Figure 9:
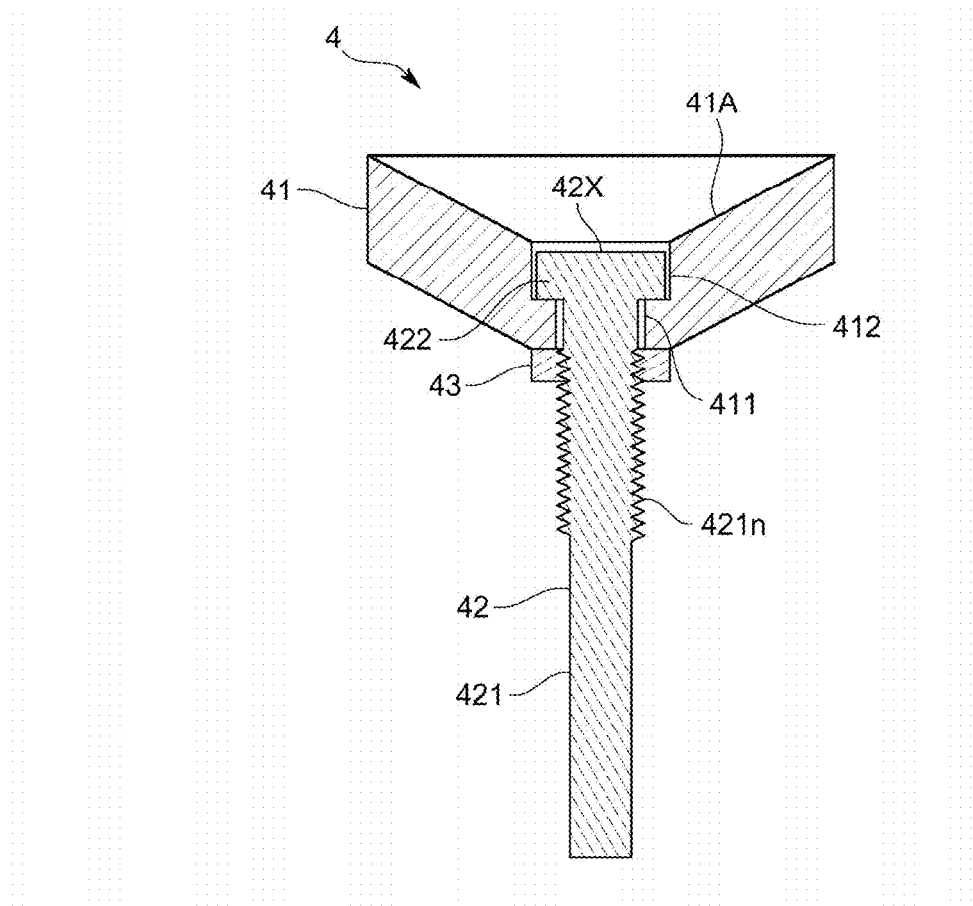
FIG. 9 is a schematic sectional view illustrating the modified repeller structure.
Figure 10:
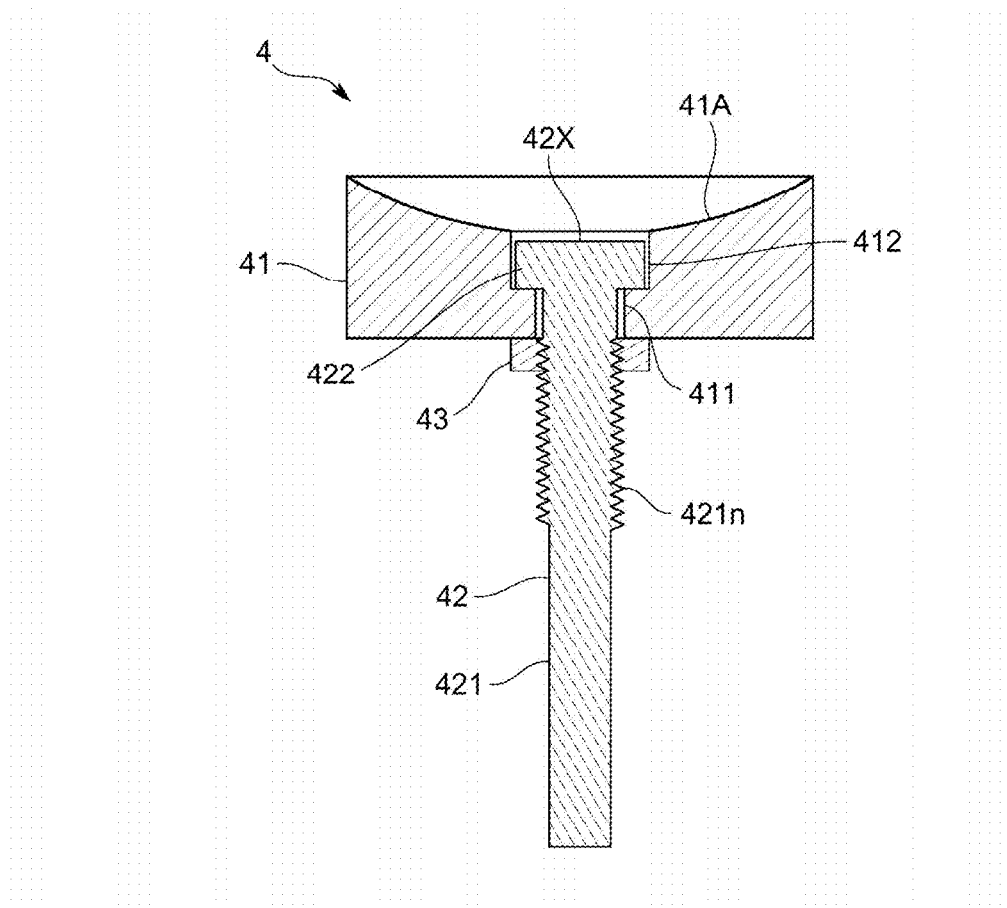
FIG. 10 is a schematic perspective view illustrating another example of modification of the repeller structure.

For example, in the above embodiment, the sputterable surface 41A of the target member is entirely formed as a flat surface. Alternatively, as illustrates in FIGS. 8 and 9, the sputterable surface may include a concave tapered surface which is annularly formed about the through-hole 411. Alternatively, as illustrated in FIG. 10, the sputterable surface may include a concave curved surface which is annularly formed about the through-hole 411. The sputterable surface 41A may be formed as the concave tapered surface or the concave curved surface, in the above manner. In this case, electrons reflected by the repeller structure 4 can be concentrated around the ion extraction port 22 of the plasma generating chamber 2, and a degree of ionization can be raised to increase a gallium ion beam current.

Further, a coupling structure between the target member 41 and the repeller body 42 in the repeller structure 4 is not limited to that in the above embodiment, but may be variously modified, for example, as follows.

Figure 11A:
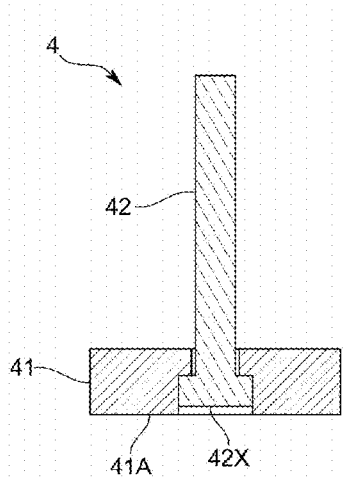
FIGS. 11(A) to 11(D) are schematic diagrams illustrating various other examples of modification of the repeller structure.

As illustrated in FIG. 11(A), the repeller structure 4 may be fixed in a posture where it is oriented vertically downwardly (the hot cathode 3 and the repeller structure 4 in the above embodiment are arranged upside down). In this case, there is no need to use the nut member 43. It is also unnecessary to provide the threaded portion 421n on the repeller body 42. This makes it possible to facilitate structural simplification, and reduce the number of components.

Figure 11B:
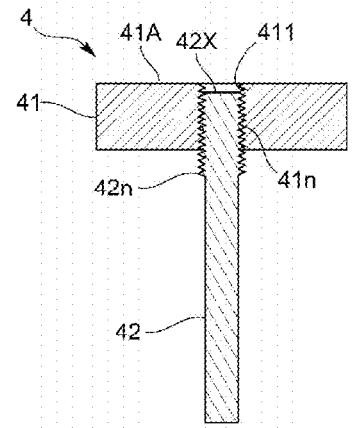

As illustrated in FIG. 11(B), the coupling structure may be configured such that a threaded portion 411n is formed on an inner peripheral surface of the through-hole 411 of the target member 41, and a threaded portion 42n is formed on an outer peripheral surface of a distal end of a rod-shaped repeller body 42, wherein the target member 41 and the repeller body 42 is coupled together by screwing the threaded portion 42n into the threaded portion 411n. In this case, a distal edge surface of the inserted end of the repeller body 42 serves as the repeller surface 42X.

Figure 11C:
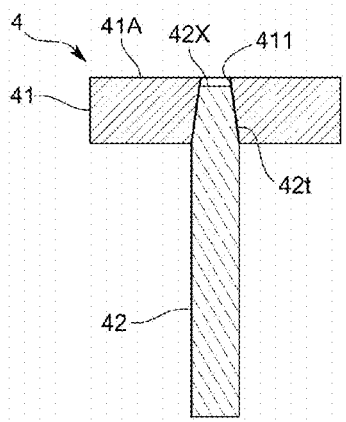

As illustrated in FIG. 11(C), the coupling structure may be configured such that the through-hole 411 of the target member 41 is formed in a tapered shape having an inner diameter which gradually increases in a downward direction, and a distal end of a rod-shaped repeller body 42 is formed in a tapered shape having an outer diameter which gradually decreases toward an edge of the distal end, wherein the tapered distal end of the repeller body 42 is fitted into the through-hole 411. In this case, a distal edge surface of the inserted end of the repeller body 42 serves as the repeller surface 42X. This eliminates a need for forming a threaded portion, so that it becomes possible to facilitate structural simplification, and reduce the number of components. Alternatively, the coupling structure may be configured such that only one of the through-hole 411 of the target member 41 and the distal end of the repeller body 42 is formed in a tapered shape, and a latch mechanism is provided which is to be activated when the distal end of the repeller body 42 is inserted into the through-hole 411 of the target member 41.

Figure 11D:
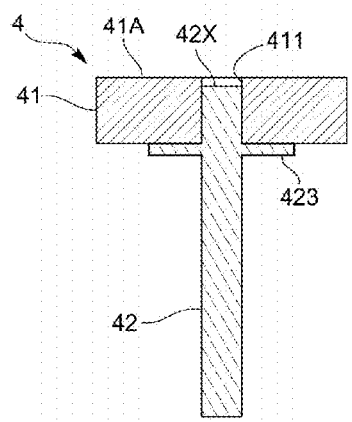

As illustrated in FIG. 11(D), the coupling structure may be configured such that the repeller body 42 has a support portion 423 provided at an intermediate position thereof to support the target member 41 from therebelow, wherein, under a condition that a distal end of the repeller body 42 is inserted into the through-hole 411 of the target member 41, the support portion 423 can support the target member 41 so as not to fall downwardly. In this case, a distal edge surface of the inserted end of the repeller body 42 serves as the repeller surface 42X. This eliminates a need for forming threaded portions on the repeller body 42 and the target member 41, so that it becomes possible to facilitate structural simplification.

Figure 12A:
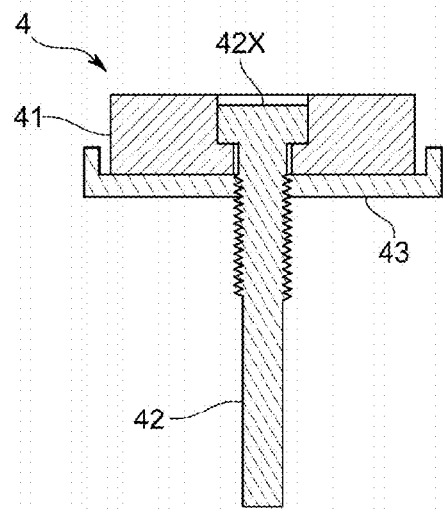
FIGS. 12(A) and 12(B) are schematic diagrams illustrating other examples of modification of the repeller structure.

As for the configuration of the nut member 43, as illustrated in FIG. 12(A), the nut member 43 may be configured to cover the entire lower surface of the target member 41 under the condition that it fixedly clamps the target member 41 in cooperation with the large-diameter portion 422. This makes it possible to, in the event of breakage of the target member 41, prevent falling of resulting broken pieces, and prevent deterioration in the efficiency of ion generation by sputtering. In order to further effectively prevent falling of the target member 41, the nut member 43 may have a dish-like shape which covers an outer periphery of the target member 41.

Figure 12B:
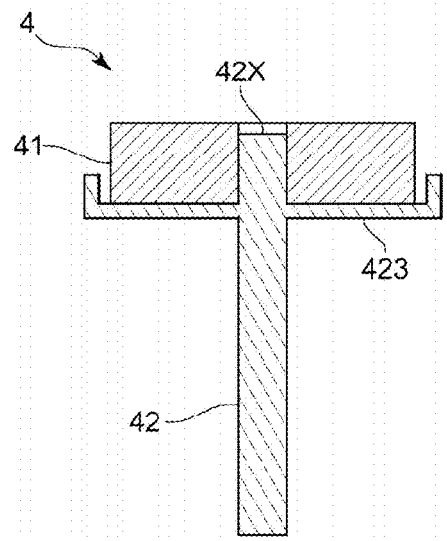

In the repeller structure configured to be devoid of the nut member 43, as illustrated in FIG. 12(B), the support portion 423 may be formed to cover the entire lower surface of the target member 41 or may be formed in a dish-like shape which covers an outer periphery of the target member 41. In this case, if the support portion 423 is integrally formed with the repeller body 42, a production cost is likely to be increased. Thus, the support portion 423 may be formed such that a support member as the support portion is prepared separately from a body member of the repeller body 42, and the body member is inserted into a hole of the support member.

In the above embodiment, the hot cathode is an indirectly-heated type. Alternatively, the hot cathode may be any other suitable type, such as a directly-heated type.

In the above embodiment, the repeller structure 4 is fixed by the holding mechanism. Alternatively, the repeller structure 4 may be fixed to the plasma generating chamber through an insulator.

The shape of the target member is not limited to a generally circular disk shape, but may be any other suitable shape. The sectional shape of the repeller body is not limited to a circular shape, but may be any other suitable shape as long as it is insertable into the through-hole formed in the target member.

It is to be understood that the present invention is not limited to the above embodiment, but various changes and modifications may be made therein without departing from the spirit and scope thereof as set forth in appended claims.

EXPLANATION OF CODES

100: ion source
2: plasma generating chamber
22: ion extraction port
3: cathode (hot cathode)
3a: electron emitting portion
4: repeller structure
41: target member
41A: sputterable surface
411: through-hole
412: counterbored portion
42: repeller body
42X: repeller surface
422: large-diameter portion
421n: threaded portion
43: nut member

What is claimed is:

1. An ion source comprising:
a plasma generating chamber configured to serve as a container for generating therein a plasma and as an anode, while allowing a source gas to be introduced therein;
a cathode provided in the plasma generating chamber and configured to emit electrons for ionizing the source gas to generate the plasma; and
a repeller structure disposed in opposed relation to the cathode within the plasma generating chamber to reflect the electrons toward the cathode, wherein the repeller structure comprises:
a target member configured to be sputtered by the plasma to emit given ions, and provided with a through-hole penetrating between a sputterable surface and a reverse surface thereof; and
a repeller body which supports the target member while being inserted in the through-hole of the target member, and has a repeller surface exposed on the side of the sputterable surface through the through-hole, the target member directly contacting the repeller body and being electrically conductive with respect to each other, and
wherein a center of an electron emitting portion of the cathode and a center of the repeller surface are located approximately coaxially with each other, and
wherein the target member is made of a material selected from the group consisting of gallium oxide, gallium nitride, gallium phosphide, gallium arsenide and gallium fluoride, and a magnet is provided outside the plasma generating chamber to generate a magnetic field along a line that, connects the cathode to the repeller structure positioned in the plasma generating chamber, the magnetic field being parallel to a plasma generating chamber axis, so as to cause electrons to move back and forth between the cathode and the repeller while circling the magnetic field, with the direction of the magnetic field as its rotating axis, and
further wherein the plasma generating chamber is provided with an ion extraction port arranged on the plasma generating chamber parallel to the plasma generating chamber axis.

2. The ion source as defined in claim 1, wherein:
the target member has a counterbored portion formed by diametrically expanding an opening region of the through-hole on the side of the sputterable surface; and
the repeller body has a large-diameter portion formed at a distal end thereof and engageable with the counterbored portion,
wherein, under a condition that the large-diameter portion is engaged with the counterbored portion, the target member is supported by the repeller body, and a distal edge surface of the large-diameter portion is the repeller surface.

3. The ion source as defined in claim 2, wherein, under the condition that the engageable portion is engaged with the counterbored portion, the sputterable surface is located on the side of the cathode with respect to the repeller surface.

4. The ion source as defined in claim 2, wherein the repeller body has a threaded portion on an outer peripheral surface thereof, and wherein a nut member is screwed onto the threaded portion from the side of the reverse surface of the target member, so that the target member is fixedly clamped by the large-diameter portion and the nut member.

5. The ion source as defined in claim 1, wherein the target member has a generally circular disk shape, and wherein the through-hole is formed in an approximately central region of the target member.

6. The ion source as defined in claim 1, wherein the sputterable surface of the target member includes a concave tapered surface or a concave curved surface, which is annularly formed about the through-hole.

7. The ion source as defined in claim 1, wherein the source gas is phosphorus fluoride or boron fluoride.

\* \* \* \* \*